(12) United States Patent
Iwaki et al.

(10) Patent No.: US 6,849,137 B2
(45) Date of Patent: Feb. 1, 2005

(54) NB₃SN-SYSTEM SUPERCONDUCTIVE WIRE

(75) Inventors: Genzo Iwaki, Ibaraki (JP); Morio Kimura, Ibaraki (JP)

(73) Assignee: Hitachi Cable, Ltd., Tokyo (JP)

( * ) Notice: Subject to any disclaimer, the term of this patent is extended or adjusted under 35 U.S.C. 154(b) by 265 days.

(21) Appl. No.: 09/932,458

(22) Filed: Aug. 20, 2001

(65) Prior Publication Data

US 2003/0045433 A1 Mar. 6, 2003

(51) Int. Cl.⁷ .......................... C22F 1/08; C22C 27/02; H01L 39/24
(52) U.S. Cl. ...................... 148/98; 505/806; 174/124.1; 420/425; 420/901; 29/599
(58) Field of Search ................................ 505/806, 813; 420/901, 425; 174/125.1; 148/98 OR; 29/599

(56) References Cited

U.S. PATENT DOCUMENTS

| | | | | |
|---|---|---|---|---|
| 4,746,581 A | * | 5/1988 | Flukiger | ...................... 428/614 |
| 5,364,709 A | * | 11/1994 | Yu | .............................. 428/662 |
| 5,926,942 A | * | 7/1999 | Kubo et al. | .................... 29/599 |

OTHER PUBLICATIONS

Properties of fiber–reinforced niobium–tin superconductor fabricated by bronze process, H. Tateishi, K. Agatsuma, K. Arai and M. Umeda, Electrotechnical Laboratory, Tsukuba, Ibaraki, Japan, Fujikura, Co. Ltd., Kotoku, Tokyo, Japan, IEEE Transactions on Applied Superconductivity, vol. 9, No. 2, Jun. 1999.

Mechanical Properties of a Niobium–Tin Superconductor Reinforced by Tantalum Cores, J. Kondoh, H. Tateishi, M. Umeda, K. Arai, K Agatsuma, K. Gotoh, and T. Saitoh, IEEE Transactions on Applied Superconductivity, vol. 11, No. 1, Mar. 2001.

Matsukura, et al., "Development of Nb₃Sn Supervonductor for 1 GHz Class NMR Magnet–High Strength Nb₃Sn Superconductor", The 56th Meeting on Cryogenics and Superconductivity, May 15, 1997, no english abstract or disclosure.

Kondoh, et al., "Irreversible Strain Limit of Fiber–Reinforced–Nb₃Sn Superconductors", The 60th Meeting on Cryogenics and Superconductivity, Jun. 9, 1999, no english ab or disclosure.

* cited by examiner

Primary Examiner—Mark Kopec
(74) Attorney, Agent, or Firm—Antonelli, Terry, Stout & Kraus, LLP

(57) ABSTRACT

An $Nb_3Sn$-based superconductive wire which, when used in a superconductive magnet, manifests sufficient strength also against force along the radius direction in operating the magnet and reveals little deterioration in properties due to mechanical strain ascribable to the force along the radius direction is provided. An $Nb_3Sn$-based superconductive wire comprising a bronze/filament aggregate obtained by placing a lot of niobium (Nb) or niobium alloy filaments in a copper (Cu)-tin (Sn)-based alloy matrix, wherein said niobium or niobium alloy filament constituting the bronze/filament aggregate 3' is a composite filament 5 obtained by combining with a filament reinforcing material having mechanical strength under temperature not more than room temperature after thermal treatment for producing an $Nb_3Sn$-based superconductive compound, larger than the mechanical strength of the niobium or niobium alloy.

9 Claims, 3 Drawing Sheets

1 STABILIZING COPPER
2 DIFFUSION BARRIER
3' BRONZE/COMPOSITE FILAMENT AGGREGATE

5 COMPOSITE FILAMENT
6 NOIBIUM (Nb) OR A NIOBIUM ALLOY
7 REINFORCING MATERIAL

5 COMPOSITE FILAMENT
6 NOIBIUM (Nb) OR A NIOBIUM ALLOY
7 REINFORCING MATERIAL

NB₃SN-SYSTEM SUPERCONDUCTIVE WIRE

BACKGROUND OF THE INVENTION

1. Field of the Invention

The present invention relates to an Nb$_3$Sn-based superconductive wire, and particularly, to an Nb$_3$Sn-based superconductive wire which, when used in a superconductive magnet, manifests sufficient strength also against force along the radius direction in operating the magnet and reveals little deterioration in properties due to mechanical strain ascribable to the force along the radius direction.

2. Prior Art

Nb$_3$Sn-based superconductive wires have a critical magnetic property of about 25 T, and widely used in superconductive magnets of 10 T or more. However, superconductive wires composed of compounds such as Nb$_3$Sn and the like have a defect that properties, particularly, critical current property deteriorates by mechanical strain. In a superconductive magnet, electromagnetic force acts constantly on a superconductive wire in the magnet due to the magnetic field of the magnet and energizing current.

Further, since superconductive magnets made of Nb$_3$Sn-based superconductive wires are finally formed by thermal treatment for producing an Nb$_3$Sn-based compound, at 600 to 750° C. for a long period of time, sufficient strength is not obtained by general Nb$_3$Sn-based superconductive wires.

Consequently, in designing of superconductive magnets made of Nb$_3$Sn-based superconductive wires, complicated designing in view of change of properties of the wire due to the action of electromagnetic force is required. Therefore, development of an Nb$_3$Sn-based superconductive wire having high strength property is desired.

FIG. 1 is a sectional view schematically showing the constitution of a conventional Nb$_3$Sn-based superconductive wire.

As shown in FIG. 1, as a method of increasing the strength of an Nb$_3$Sn-based superconductive wire, there is suggested a superconductive wire in which Ta is placed as a center reinforcing material 4 at the center of the section of a so-called bronze method Nb$_3$Sn-based superconductive wire having an aggregate 3 formed by placing a lot of Nb or Nb alloy filaments in a copper-tin-based alloy matrix and having stabilizing copper 1 and diffusion barrier 2 on the periphery thereof (T. Hase et at., Bronze Route Conductors for 1 GHz NMR Superconducting Magnet IEEE Trans. Appl. Supercond., Vol. 10, No. 1, pp 965–970 (2000)). The aggregate 3 is produced by inserting a lot of Nb or Nb alloy filaments into a copper-tin-based alloy tube and performing diameter-reduction process on this.

Generally, in a superconductive magnet, mechanical forces act on a superconductive wire in winding by electromagnetic force along the axis direction and radius direction, and of them, regarding strain by force along the axis direction, the above-mentioned suggestion in which strength along the axis direction of a superconductive wire is increases is effective.

However, the wire according to the above-mentioned suggestion has a problem that there is a tendency of deterioration in properties of a superconductive wire, particularly, critical current property, due to strain by force along the radius direction since strength along the radius direction is equivalent to that of a wire containing no reinforcing material.

SUMMARY OF THE INVENTION

Therefore, an object of the present invention is to provide an Nb$_3$Sn-based superconductive wire which, when used in a superconductive magnet, manifests sufficient strength also against force along the radius direction in operating the magnet and reveals little deterioration in properties due to mechanical strain ascribable to the force along the radius direction.

The present invention provides an Nb$_3$Sn-based superconductive wire described below for attaining the above-mentioned object.

[1] An Nb$_3$Sn-based superconductive wire comprising a bronze/filament aggregate obtained by placing a lot of niobium (Nb) or niobium alloy filaments in a copper (Cu)-tin (Sn)-based alloy matrix, wherein the above-mentioned niobium or niobium alloy filament constituting the above-mentioned bronze/filament aggregate is a composite filament obtained by combining with a filament reinforcing material having mechanical strength under temperature not more than room temperature after thermal treatment for producing an Nb$_3$Sn-based superconductive compound, larger than the mechanical strength of said niobium or niobium alloy.

[2] The Nb$_3$Sn-based superconductive wire according to [1] wherein the above-mentioned filament reinforcing material is composed of at least one metal selected from the group consisting of a niobium alloy, tantalum (Ta), tantalum alloy, tungsten (W), tungsten alloy, titanium (Ti), titanium alloy, molybdenum (Mo), molybdenum alloy, vanadium (V), vanadium alloy, zirconium (Zr), zirconium alloy, hafnium (Hf) and hafnium alloy.

[3] The Nb$_3$Sn-based superconductive wire according to [1] wherein the above-mentioned composite filament comprises the above-mentioned filament reinforcing material in volume fraction of 0.05 to 0.65 in the composite filament.

[4] The Nb$_3$Sn-based superconductive wire according to [1] wherein the above-mentioned composite filament has a diameter of 15 μm or less.

[5] The Nb$_3$Sn-based superconductive wire according to [1] wherein the volume ratio of the niobium or niobium alloy forming the above-mentioned composite filament to the copper-tin-based alloy matrix is 0.8 or more and 2.5 or less and the volume ratio of the composite filament to the copper-tin-based alloy matrix is 0.3 or more.

The present invention can provide, by the above-mentioned embodiments [1] to [5], an Nb$_3$Sn-based superconductive wire which, when used in a superconductive magnet, manifests sufficient strength also against force along the radius direction in operating the magnet and reveals little deterioration in properties due to mechanical strain ascribable to the force along the radius direction.

Namely, the above-mentioned niobium (Nb) or niobium alloy filament is combined with the above-mentioned reinforcing material to give a composite filament and the volume ratio of the above-mentioned filament reinforcing material in the above-mentioned composite filament is set in a specific range, consequently, even in thermal treatment for producing an Nb$_3$Sn-based superconductive compound (600 to 750° C. for 10 hours or more), contamination of a niobium (Nb) niobium alloy in a filament diffusion or reactions such as production of a compound, and the like do not occur easily and reduction in mechanical strength can be suppressed.

Further, because of increase in mechanical strength as an Nb$_3$Sn-based superconductive wire, application possibility of a so-called React & Wind method in which heat treatment to produce Nb$_3$Sn-based compound is effected before winding can be enhanced.

DETAILED DESCRIPTION OF PREFERRED EMBODIMENTS

The embodiments of the present invention will be specifically illustrated below referring to drawings.

Figure 2:
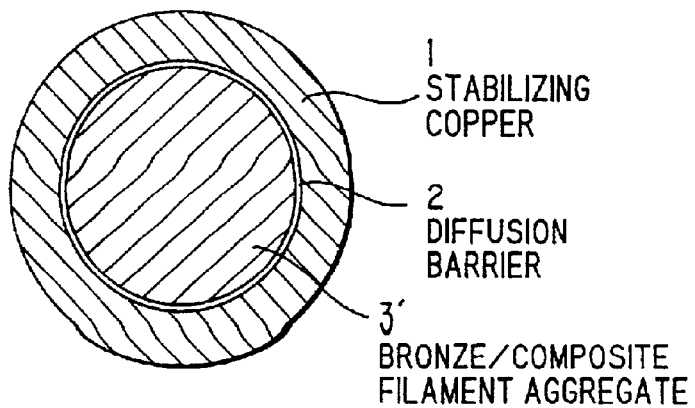
FIG. 2 is a sectional view schematically showing one embodiment of the Nb$_3$Sn-based superconductive wire of the present invention.

FIG. 2 is a sectional view schematically showing one embodiment of the Nb$_3$Sn-based superconductive wire of the present invention.

Figure 1:
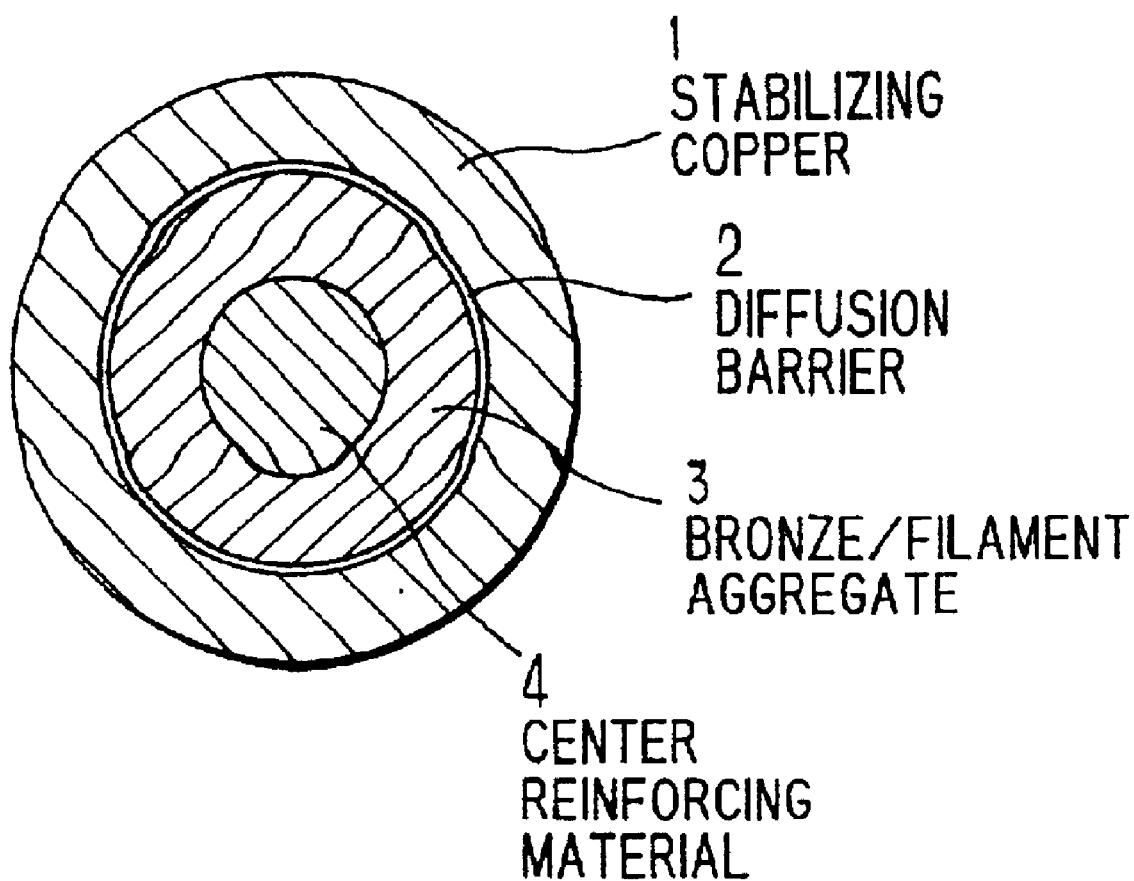
FIG. 1 is a sectional view schematically showing the constitution of a conventional Nb$_3$Sn-based superconductive wire.

As shown in FIG. 2, the Nb$_3$Sn-based superconductive wire of the present invention uses, as the above-mentioned constituting an aggregate 3' (corresponding to aggregate 3 in FIG. 1), a composite filament obtained by combining with a filament reinforcing material having mechanical strength under temperature not more than room temperature after thermal treatment for producing an Nb$_3$Sn-based superconductive compound, larger than the mechanical strength of the above-mentioned niobium or niobium alloy. On the periphery of the aggregate 3' constituted of the composite filament, stabilizing copper 1 and a diffusion barrier 2 are provided.

A structure in which positions of the stabilizing copper 1 and the composite filament aggregate 3' in FIG. 2 are inverted may also be permissible. Though the stabilizing material is copper in FIG. 2, it may also be aluminum (Al) or an aluminum alloy.

Further, though the Nb$_3$Sn-based superconductive wire of the present invention has circular sectional form in FIG. 2, utterly the same effect can be obtained even if the section is in the form of rectangle.

Composite ratio of the stabilizing material exerts an influence on the strength of a wire. When the composite ratio of the stabilizing material is not suitable, the effect of the composite filament in the present invention is not manifested, therefore, the volume ratio of the stabilizing material to non-stabilizing materials in the wire of the present invention is desirably 4.0 or less.

On the other hand, for producing a superconductive magnet from an Nb$_3$Sn-based superconductive wire, it is generally used as a so-called Wind & React method in which thermal treatment is effected after winding. In this method, it is necessary to provide braiding made of an insulation layer of glass fiber or ceramic fiber before winding. By this insulation layer, occupancy ratio by a wire in a coil decreases. Therefore, the wire of the present invention has a diameter (in the case of rectangle section, corresponding diameter) of preferably ϕ0.7 mm or more.

Figure 3:
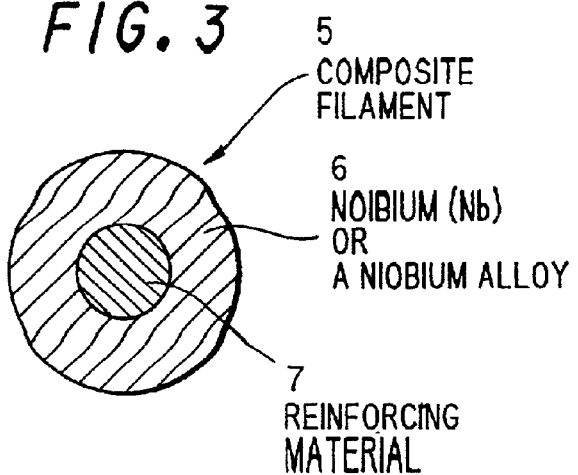
FIG. 3 is a sectional view schematically showing one embodiment of a composite filament used in the present invention.

FIG. 3 is a sectional view schematically showing one embodiment of a composite filament used in the present invention.

As shown in FIG. 3, the composite filament 5 is obtained by combining niobium or a niobium alloy 6 with a filament reinforcing material 7 having mechanical strength under temperature not more than room temperature after thermal treatment for producing an Nb$_3$Sn-based superconductive compound, larger than the mechanical strength of the above-mentioned niobium or niobium alloy, as described above.

Though FIG. 3 shows an embodiment in which the composite filament is formed from 2 layers, of the niobium or niobium alloy 6 and the reinforcing material 7, the reinforcing material 7 may also be constituted of a plurality of metals selected from metals applicable to the filament reinforcing material of the present invention.

Figure 4:
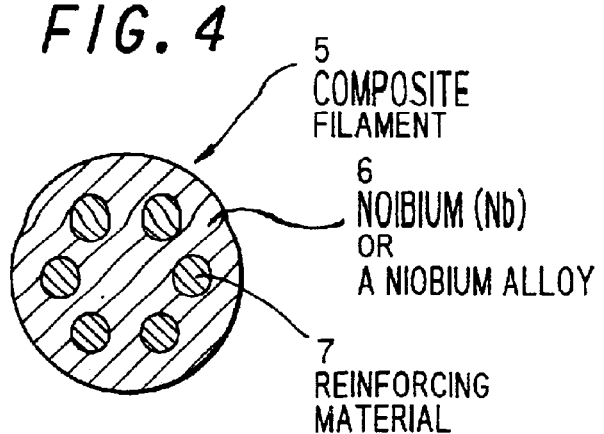
FIG. 4 is a sectional view schematically showing another embodiment of a composite filament used in the present invention.

FIG. 4 is a sectional view schematically showing another embodiment of a composite filament used in the present invention.

As shown in FIG. 4, a dispersion type embodiment may also be permissible in which the same filament reinforcing material 7 is dispersed in niobium or a niobium alloy 6.

The filament reinforcing material 7 is not particularly restricted providing the above-mentioned mechanical strength under temperature not more than room temperature after thermal treatment for producing an Nb$_3$Sn-based superconductive compound is larger than the mechanical strength of niobium or a niobium alloy, and materials composed of at least one metal selected from a niobium alloy, tantalum (Ta), tantalum alloy, tungsten (W), tungsten alloy, titanium (Ti), titanium alloy, molybdenum (Mo), molybdenum alloy, vanadium (v), vanadium alloy, zirconium (Zr), zirconium alloy, hafnium (Hf) and hafnium alloy are listed as preferable examples.

The volume fraction of a filament reinforcing material in a composite filament is usually from 0.05 to 0.65. When less than 0.05, deterioration in critical current tends to occur due to load along the transverse direction, and when over 0.65, level of critical current property is low, lacking in serviceability.

The present invention is remarkable in enabling production of a superconductive magnet according to a React & Wind method which is almost impossible by a conventional Nb$_3$Sn wire. As a magnet obtained by a React & Wind method, there is envisaged application to a conductive cooling magnet with a refrigerator using no liquid helium as a refrigerant. Regarding the conductive cooling magnet, it is needless to say that if heat generation in a winding part in magnet excitation is not lower than cooling ability of the refrigerator, the apparatus doe not work out. The main cause of heat generation in a winding part in excitation of a magnet is a hysteresis loss of a superconductive wire, and this hysteresis loss is in proportion to the diameter of a filament. The filament diameter in the present invention is identical with the diameter of a composite filament, and the diameter of a composite filament is required to be 15 μm or less.

In the present invention, critical current property and strength in the relation of trade off, and when the composite ratio of a reinforcing material in a composite filament is increased for suppressing deterioration in critical current against strain along the radius direction of a wire which is a main point of the present invention, there occurs necessarily a decrease in the proportion of niobium or a niobium alloy in a composite filament in contact with a copper-tin-based alloy contributing to production of an Nb$_3$Sn-based superconductive compound, leading to lowering of critical current.

To prevent this and obtain practically sufficient critical current property, it is necessary to optimize the volume ratio of niobium or a niobium alloy to a copper-tin-based alloy matrix in a composite filament concerning production of an Nb₃Sn-based superconductive compound and to decrease the proportion of an unnecessary copper-tin-based alloy. The optimum range is preferably 0.8 or more and 2.5 or less. This range is restricted by the range of tin concentration (14 wt % or more, 30 wt % or less) of a copper-tin-based alloy matrix applicable in the present invention, and in the case of a copper-tin-based alloy matrix of 14 wt % Sn, when the volume ratio of niobium or a niobium alloy to a copper-tin-based alloy matrix in a composite filament is over 2.5, an unnecessary copper-tin-based alloy matrix shall be combined. To decrease the volume ratio of niobium or a niobium alloy to a copper-tin-based alloy matrix in a composite filament lower than 0.8, the concentration of tin in the copper-tin-based alloy has to be raised over 30 wt %, and in this case, the ductility of the copper-tin-based alloy matrix disappears and combination as a superconductive wire becomes impossible, meaning no possibility of application.

In the present invention, the volume ratio of a composite filament to a copper-tin-based alloy matrix becomes necessarily lower than the volume ratio of niobium or a niobium alloy to a copper-tin-based alloy matrix in a composite filament. When the aggregate 3' in one embodiment of the present invention shown in FIG. 2 is formed of a sub element obtained by burying one or more composite filaments in a copper-tin-based alloy matrix, if the volume ratio of a composite filament to a copper-tin-based alloy matrix is decreased, the area-reduction process of the sub element becomes difficult. Therefore, the volume ratio of a composite filament to a copper-tin-based matrix must be 0.3 or more.

The present invention will be illustrated further specifically below referring to examples.

Various properties of Nb₃Sn-based superconductive wires of 1.0 diameter produced in examples and comparative examples of the present invention are shown in Table 1.

EXAMPLE 1

Industrial pure Ta was used as a filament reinforcing material in composite filament, the diameter of the filament reinforcing material when the wire got the final wire diameter was 2 μm for an outer diameter of the composite filament of 5 μm. The volume fraction of the filament reinforcing material in the composite filament was 0.16. A niobium (Nb)-1 wt % tantalum (Ta) alloy was used as a filament substrate material and a copper (Cu)-14.5 wt % tin (Sn)-0.3 wt % titanium (Ti) was used as a copper (Cu)-tin (Sn)-based alloy matrix. Industrial pure Ta was used a diffusion barrier, and the thickness thereof was about 19 μm. The volume ratio of non-stabilizing copper parts to a stabilizing copper part (stabilizing copper ratio) was controlled to about 1.

EXAMPLES 2 AND 3

Wires were produced in the same manner as in Example 1 except that the volume fractions of a filament reinforcing material in a composite filament were 0.40 and 0.59, respectively, in Example 1.

Comparative Example 1

A wire was produced in the same manner as in Example 1 except that a filament was made of a single phase and no special filament reinforcing material was combined and Ta was placed as a reinforcing material at the center of the wire, in Example 1.

Comparative Example 2

A wire was produced in the same manner as in Example 1 except that the volume fraction of a filament reinforcing material was 0.048, in Example 1.

Comparative Example 3

A wire was produced in the same manner as in Example 1 except that the volume fraction of a filament reinforcing material was 0.68, in Example 1.

Comparative Example 4

A general Nb₃Sn-based superconductive wire containing no reinforcing material at all.

These wires produced were thermally treated at 650° C. for 200 hours in vacuum and compressed transversely to the axis of the wire. The change of critical current in this process was measured in magnetic field.

Figure 5:
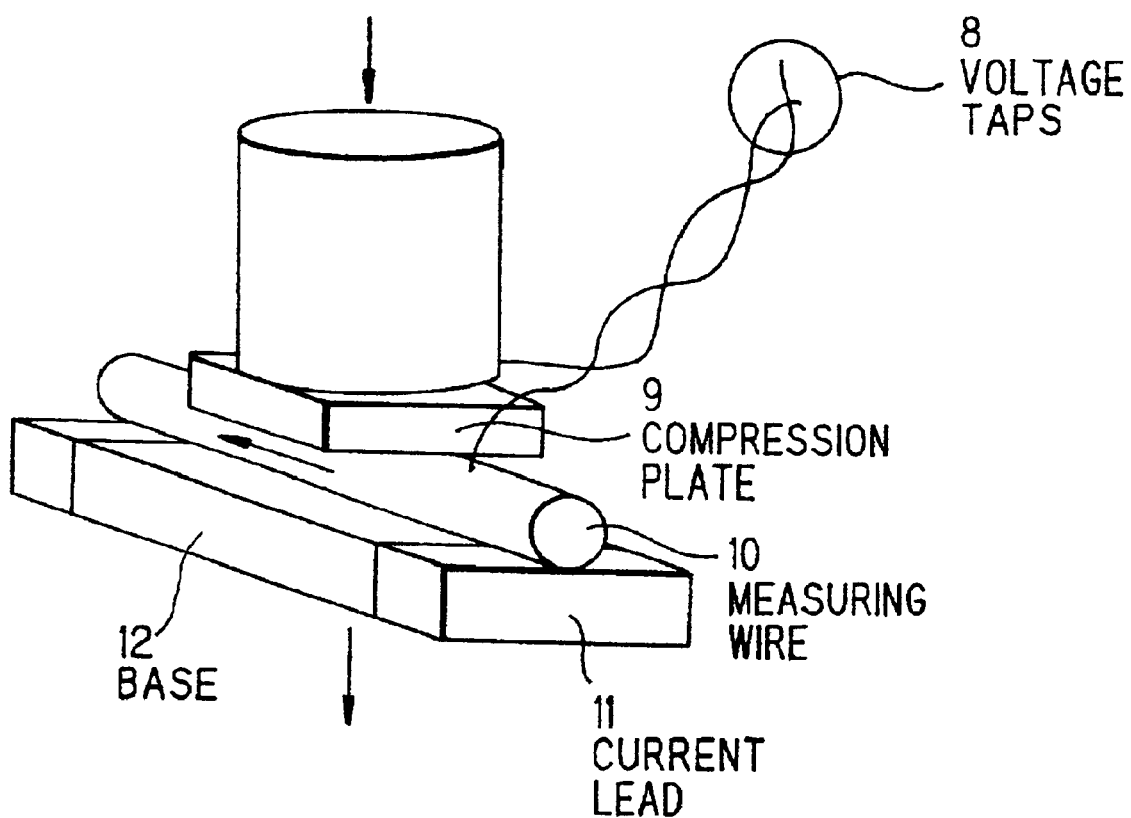
FIG. 5 is an explanation view schematically showing a measuring method which measures in magnetic field the change of critical current when a wire obtained in an example or comparative example of the present invention is thermally treated at 650° C. for 200 hours in vacuum and this is compressed transversely to the wire axis.

FIG. 5 is an explanation view schematically showing a measuring method which measured in magnetic field the change of critical current when a wire obtained in an example or comparative example of the present invention was thermally treated at 650° C. for 200 hours in vacuum and this was compressed transversely to the wire axis.

As shown in FIG. 5, a load of 75 kgf was applied by GFRP (G10) having a length of 5 mm and a width of 5 mm via a compression plate 9 along the vertical direction to the axis of a measuring wire 10, and the critical current of the measuring wire 10 was measured under this condition, and compared with critical current value in the case of no load. The measurement of critical current was conducted by a four-probe method, distance between voltage taps 8 was about 10 mm, and 1.0 μV/cm criterion was used for definition of critical current. Applied magnetic field is 12 T, and which is applied vertically to wire axis. Further, uni-axial tensile test of these wires was conducted in liquid helium, and 0.2% proof stress were compared. In FIG. 5, mark 11 represents a current lead, and mark 12 represents a base, respectively.

The measuring results are shown in Table 2. This table includes measuring results of critical currents under a load of 75 kgf and no load, and critical current ratio is a ratio of critical current value under load to critical current value under no load. As shown in these results, it is known that critical current and deterioration by transverse compression were improved significantly in Example 1 while critical current decreased steeply due to load along the transverse direction in Comparative Examples 1, 2 and 4. In Comparative Example 3, deterioration in critical current due to transverse compression is small, however, since level of critical current property under no load is lower by far than practical level, critical current property under load decreases resultantly. The reason for this is increase in combination amount of a filament reinforcing material, and practically, the volume fraction of a filament reinforcing material is required to be 0.65 or less.

Further, at 0.2% proof stress shown as a result of the tensile test in liquid helium (4.2 K), Example 1 shows a value of as low as 205 MPa, as compared with 254 MPa in Comparative Example 1, however, as compared with Comparative Example 4 regarding a conventional Nb₃Sn-based wire combining with no filament reinforcing material at all, 0.2% proof stress increased remarkably and practically excellent results were obtained. In Examples 2 and 3, 0.2% proof stress equivalent to that of Comparative Example 1 or higher are obtained, and compression strength along the transverse direction and strength along the axis direction are also reinforced. From those results, it is known that the volume fraction of a reinforcing material in a composite filament of the present invention is suitably from 0.05 to 0.65.

TABLE 1

| Item | Example 1 | Example 2 | Example 3 | Comparative Example 1 | Comparative Example 2 | Comparative Example 3 | Comparative Example 4 |
|---|---|---|---|---|---|---|---|
| Wire diameter | 1.0 | 1.0 | 1.0 | 1.0 | 1.0 | 1.0 | 1.0 |
| Filament diameter ($\mu$m) | 5.0 | 4.9 | 5.2 | 5.1 | 5.0 | 5.0 | 5.0 |
| Filament Number | 6.631 | 7.889 | 9.481 | 4.218 | 5.947 | 11.077 | 5.947 |
| Filament reinforcing material | Tantalum | Tantalum | Tantalum | — | Tantalum | Tantalum | — |
| Volume fraction of filament reinforcing material | 0.16 | 0.40 | 0.59 | — | 0.048 | 0.68 | — |
| Diameter of filament reinforcing material ($\mu$m) | 2.0 | 3.1 | 4.0 | — | 1.1 | 4.1 | — |
| Diffusion barrier material | Tantalum | Tantalum | Tantalum | Tantalum | Tantalum | Tantalum | Tantalum |
| Diffusion barrier thickness ($\mu$m) | 19 | 19 | 19 | 19 | 19 | 19 | 19 |
| Center reinforcing material | — | — | — | Tantalum | — | — | — |
| Diameter center reinforcing material (mm) | — | — | — | 0.33 | — | — | — |
| Stabilizing copper ratio | 1.0 | 1.0 | 1.0 | 1.1 | 1.0 | 1.0 | 1.0 |
| copper-tine alloy matrix versus composite filament volume ratio | 1.7 | 1.3 | 0.75 | — | 2.0 | 0.62 | — |
| copper-tine alloy matrix versus Nb 1 wt %-Ta alloy volume ratio | 2.0 | 2.2 | 1.8 | — | 2.1 | 1.9 | — |

TABLE 2

| Item | Example 1 | Example 2 | Example 3 | Comparative Example 1 | Comparative Example 2 | Comparative Example 3 | Comparative Example 4 |
|---|---|---|---|---|---|---|---|
| Transverse compression load: 0 | 286A | 204A | 181A | 192A | 244A | 148A | 258A |
| Transverse compression load: 75 kgf | 156A | 150A | 148A | 115A | 139A | 126A | 142A |
| Critical current ratio | 0.66 | 0.74 | 0.82 | 0.60 | 0.57 | 0.85 | 0.55 |
| 0.2% proof stress at 4.2 K (MPa) | 205 | 242 | 2.94 | 254 | 189 | 32D | 175 |

As described above, according to the present invention, an Nb$_3$Sn-based superconductive wire which, when used in a superconductive magnet, manifests sufficient strength also against force along the radius direction in operating the magnet and reveals little deterioration in properties due to mechanical strain ascribable to the force along the radius direction can be provided.

What is claimed is:

1. An aggregate for forming Nb$_3$Sn-based superconductive wire, comprising:

a composite filament, including niobium or a niobium alloy and a filament reinforcing material having a volume ratio of the filament reinforcing material to the composite filament of 0.05 to 0.65; and a copper (Cu)-tin (Sn)-based alloy matrix in which the composite filament is embedded;

wherein a volume ratio of the niobium or the niobium alloy forming the composite filament to the copper-tin-based alloy matrix is 0.8 or more and 2.5 or less, and a volume ratio of the composite filament to the copper-tin-based alloy matrix is 0.3 or more.

2. The aggregate according to claim 1, wherein:

the niobium alloy is a first niobium alloy, and the filament reinforcing material is selected from the group consisting of a second niobium alloy, tantalum (Ta), tantalum alloy, tungsten (W), tungsten alloy, titanium (Ti), titanium alloy, molybdenum (Mo), molybdenum alloy, vanadium (V), vanadium alloy, zirconium (Zr), zirconium alloy, hafnium (Hf) or hafnium alloy.

3. The aggregate according to claim 1, wherein the composite filament has a diameter of 15 $\mu$m or less.

4. An Nb$_3$Sn-based superconductive wire comprising;

a bronze/filament aggregate obtained by placing a plurality of niobium (Nb) filaments or niobium alloy filaments in a copper (Cu)-tin (Sn)-based alloy matrix; and heat treating said aggregate to form said Nb3Sn-based superconductive wire;

wherein said niobium or niobium alloy filament constituting said bronze/filament aggregate is a composite filament obtained by combining niobium or a niobium alloy with a filament reinforcing material having mechanical strength under temperature not more than room temperature after thermal treatment for producing an Nb$_3$Sn-based superconductive compound, larger than the mechanical strength of said niobium or niobium alloy;

wherein said composite filament comprises said filament reinforcing material in volume fraction of 0.05 to 0.65 in the composite filament;

wherein the volume ratio of the niobium or niobium alloy forming said composite filament to the copper-tin-based alloy matrix is 0.8 or more and 2.5 or less and the volume ratio of the composite filament to the copper-tin-based alloy matrix is 0.3 or more.

5. The Nb$_3$Sn-based superconductive wire according to claim 4 wherein said niobium alloy is a first niobium alloy, and said filament reinforcing material is selected from the group consisting of a second niobium alloy, tantalum (Ta), tantalum alloy, tungsten (W), tungsten alloy, titanium (Ti), titanium alloy, molybdenum (Mo), molybdenum alloy, vanadium (V), vanadium alloy, zirconium (Zr), zirconium alloy, hafnium (Hf) or hafnium alloy.

6. The Nb$_3$Sn-based superconductive wire according to claim 4 wherein said composite filament has a diameter of 15 μm or less.

7. A method of forming a Nb$_3$Sn-based superconductive wire, comprising:

combining niobium or a niobium alloy with a filament reinforcing material to form a composite filament having a volume ratio of the filament reinforcing material to the composite filament of 0.05 to 0.65;

placing the composite filament in a copper (Cu)-tin (Sn)-based alloy matrix to form a bronze/filament aggregate, having a volume ratio of the niobium or the niobium alloy forming said composite filament to the copper-tin-based alloy matrix of 0.8 or more and 2.5 or less and a volume ratio of the composite filament to the copper-tin-based alloy matrix of 0.3 or more; and heat treating the bronze/filament aggregate to form a Nb$_3$Sn-based superconductive wire;

wherein, after application the heat treating, the filament reinforcing material has a mechanical strength at room temperature or less, greater than the mechanical strength of the niobium or the niobium alloy.

8. The method according to claim 7, wherein:

the niobium alloy is a first niobium alloy, and the filament reinforcing material is selected from the group consisting of a second niobium alloy, tantalum (Ta), tantalum alloy, tungsten (W), tungsten alloy, titanium (Ti), titanium alloy, molybdenum (Mo), molybdenum alloy, vanadium (V), vanadium alloy, zirconium (Zr), zirconium alloy, hafnium (Hf) or hafnium alloy.

9. The method according to claim 7, wherein the composite filament has a diameter of 15 μm or less.

* * * * *